US009720046B2

United States Patent
Tazoe et al.

(10) Patent No.: US 9,720,046 B2
(45) Date of Patent: Aug. 1, 2017

(54) BATTERY STATE ESTIMATING DEVICE AND BATTERY STATE ESTIMATING METHOD

(75) Inventors: Kazuhiko Tazoe, Fujisawa (JP); Hideo Nakamura, Yokohama (JP); Shiho Umeki, Yokohama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 981 days.

(21) Appl. No.: 13/810,532

(22) PCT Filed: Jul. 19, 2011

(86) PCT No.: PCT/JP2011/066374
§ 371 (c)(1),
(2), (4) Date: Jan. 16, 2013

(87) PCT Pub. No.: WO2012/011472
PCT Pub. Date: Jan. 26, 2012

(65) Prior Publication Data
US 2013/0116954 A1    May 9, 2013

(30) Foreign Application Priority Data

Jul. 20, 2010 (JP) ................................. 2010-162738
Jul. 12, 2011 (JP) ................................. 2011-153665

(51) Int. Cl.
*G01R 31/36* (2006.01)
*G06F 17/00* (2006.01)

(52) U.S. Cl.
CPC ..... *G01R 31/3624* (2013.01); *G01R 31/3651* (2013.01); *G06F 17/00* (2013.01)

(58) Field of Classification Search
CPC ............. G01R 31/3606–31/3696; G06F 17/00
(Continued)

(56) References Cited

U.S. PATENT DOCUMENTS 6,362,598 B2 * 3/2002 Laig-Horstebrock et al. ............................. 320/132
6,845,332 B2 * 1/2005 Teruo .............................. 702/63
(Continued)

FOREIGN PATENT DOCUMENTS

JP   2003-185719 A   7/2003
JP   2007-24703 A    2/2007
(Continued)

OTHER PUBLICATIONS

Russian Decision on Grant, Mar. 20, 2014, 19 pages.
Korean Office Action and English translation dated Feb. 20, 2014, 5 pages.

*Primary Examiner* — Mischita Henson
*Assistant Examiner* — Christine Liao
(74) *Attorney, Agent, or Firm* — Foley & Lardner LLP

(57) ABSTRACT

A battery state estimating device being one aspect of the present invention detects a current and a terminal voltage of a secondary battery, estimates a terminal voltage of the secondary battery which is based on a predetermined battery model by using measured values I(k) and V(k) respectively of the detected current and the detected terminal voltage, and sequentially identifies a parameter $\phi\hat{}(k)$ of the battery model in such a way that the difference between a value based on the measured value of the terminal voltage and an estimate value of the terminal voltage converges to zero. Then, when a certain parameter $\phi_n$ in the identified parameter is equal to or larger than a predetermined first threshold $\delta 1$, the battery state estimating device performs upper limit processing of setting the value of the certain parameter $\phi_n$ to the first threshold $\delta 1$.

18 Claims, 8 Drawing Sheets

(58) Field of Classification Search
USPC .......................................................... 702/63
See application file for complete search history.

(56) References Cited

U.S. PATENT DOCUMENTS

| | | |
|---|---|---|
| 7,352,156 B2 | 4/2008 | Ashizawa et al. |
| 8,103,485 B2 | 1/2012 | Plett |
| 2006/0100833 A1 | 5/2006 | Plett |
| 2007/0029973 A1 | 2/2007 | Ashizawa et al. |
| 2007/0145953 A1* | 6/2007 | Asai et al. ................... 320/149 |
| 2009/0091299 A1 | 4/2009 | Lin et al. |
| 2009/0276172 A1 | 11/2009 | Nishi |
| 2010/0085057 A1* | 4/2010 | Nishi et al. ................... 324/427 |
| 2011/0130984 A1* | 6/2011 | Schmidt ............... A61N 1/3708 |
| | | 702/63 |
| 2011/0161025 A1* | 6/2011 | Tomura et al. ................ 702/63 |
| 2012/0041698 A1* | 2/2012 | Zhang et al. ................... 702/63 |
| 2012/0316812 A1* | 12/2012 | Umeki et al. ................... 702/63 |
| 2013/0013237 A1* | 1/2013 | Sato et al. ..................... 702/63 |

FOREIGN PATENT DOCUMENTS

| | | |
|---|---|---|
| JP | 2009-204314 A | 9/2009 |
| KR | 10-2009-0057300 | 6/2009 |
| RU | 2 361 333 C2 | 7/2009 |

\* cited by examiner

BATTERY STATE ESTIMATING DEVICE AND BATTERY STATE ESTIMATING METHOD

TECHNICAL FIELD

The present invention relates to a battery state estimating device and a battery state estimating method for estimating a state inside a secondary battery.

BACKGROUND ART

A control device described below is known as a control device of a secondary battery. The control device defines a predetermined battery model, estimates a terminal voltage of the secondary battery which is based on the battery model, as an estimated voltage value on the basis of measured values of a current and a terminal voltage of the secondary battery, sequentially identifies parameters of the battery model in such a way that the difference between the measured voltage value and the estimated voltage value converges to zero, and thereby estimates the state inside the battery (see, for example, Patent Literature 1).

CITATION LIST

Patent Literature

Patent Literature 1: Japanese Patent Unexamined Publication No. 2003-185719

SUMMARY OF INVENTION

In the related art described above, there is a case where the sequentially-identified parameters of the battery model include identification errors. The identification error of a certain parameter $\phi_n$ among the sequentially-identified parameters of the battery model greatly affects the estimation result of the state inside the battery. Accordingly, when the identification error of the certain parameter $\phi_n$ is large, the estimation of the state inside the battery cannot be performed properly in some cases.

An object of the present invention is to provide a battery state estimating device and a battery state estimating method capable of properly estimating a state inside a secondary battery.

One embodiment of the present invention is a battery state estimating device as follows. The battery state estimating device detects a current and a terminal voltage of a secondary battery, estimates a terminal voltage of the secondary battery which is based on a predetermined battery model by using the detected measured values of the current and the terminal voltage, and sequentially identifies parameters of the battery model in such a way that the difference between a value based on the measured value of the terminal voltage and the estimate value of the terminal voltage converges to zero. In the battery state estimating device, when a certain parameter among the identified parameters is equal to or larger than a predetermined first threshold, upper limit processing of setting a value of the certain parameter to the first threshold is performed and the problem described above is thereby solved.

In one embodiment of the present invention, when the certain parameter among the identified parameters is equal to or larger than the predetermined first threshold, the value of the certain parameter is set to the first threshold. This reduces an estimation error of the state inside battery which is caused by an identification error of the certain parameter. Accordingly, the state inside the secondary battery can be properly estimated.

DESCRIPTION OF EMBODIMENTS

One or more embodiments of the present invention are described below based on the drawings.

Figure 1:
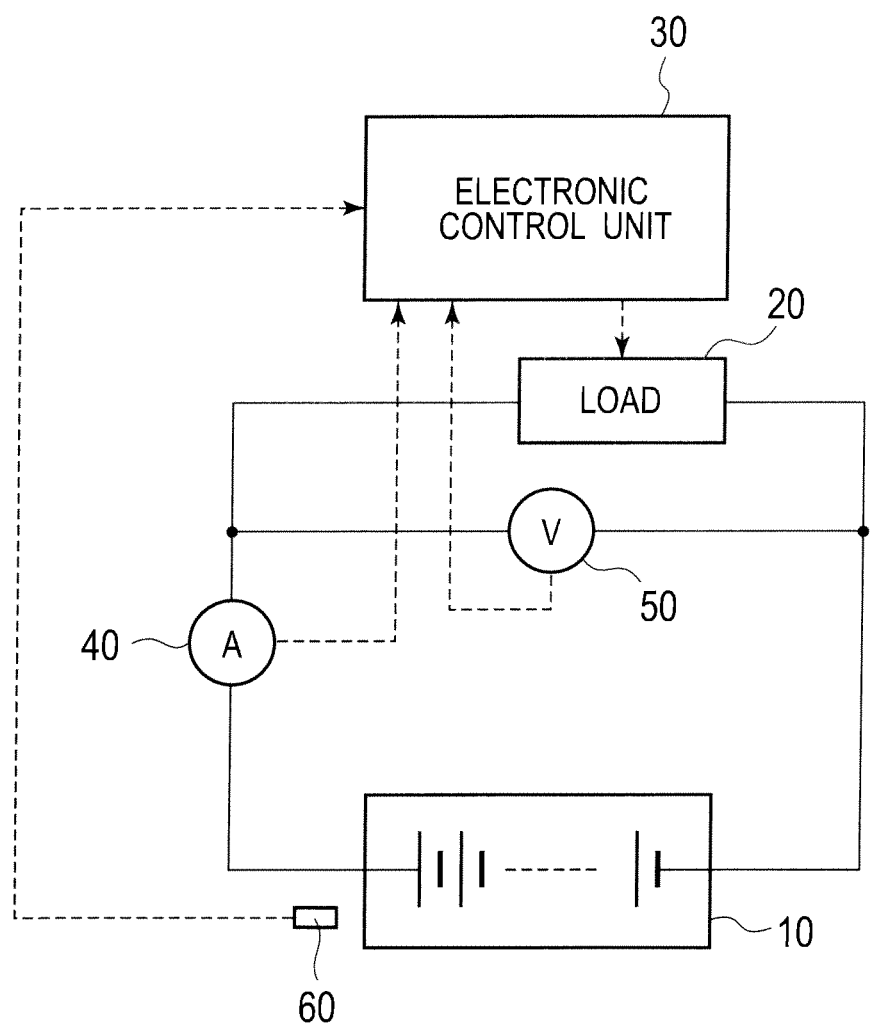
FIG. 1 is a diagram showing a configuration of a control system of a secondary battery in one or more embodiments.

FIG. 1 is a diagram showing a configuration of a control system of a secondary battery according to the embodiment. The control system shown in FIG. 1 is an example as follows. A control device of a secondary battery of the embodiment is applied to a system in which a load such as a motor is driven by a secondary battery and the secondary battery is charged by electric power generated by regeneration of the motor and electric power generated by an alternator using an engine as a power source.

A secondary battery 10 is formed by connecting multiple unit cells in series. Lithium-based secondary batteries such as lithium-ion secondary batteries can be given as an example of the unit cells forming the secondary battery 10. A motor can be given as an example of a load 20.

An ammeter 40 is a sensor configured to detect charge and discharge currents flowing through the secondary battery 10. A signal detected by the ammeter 40 is transmitted to an electronic control unit 30. Moreover, a voltmeter 50 is a sensor configured to detect a terminal voltage of the secondary battery 10. A signal detected by the voltmeter 50 is transmitted to the electronic control unit 30. A temperature sensor 60 for detecting the temperature of the secondary battery 10 is provided near the secondary battery 10. The temperature sensor 60 is a sensor using a thermocouple. A signal detected by the temperature sensor 60 is also similarly transmitted to the electronic control unit 30.

Figure 2:
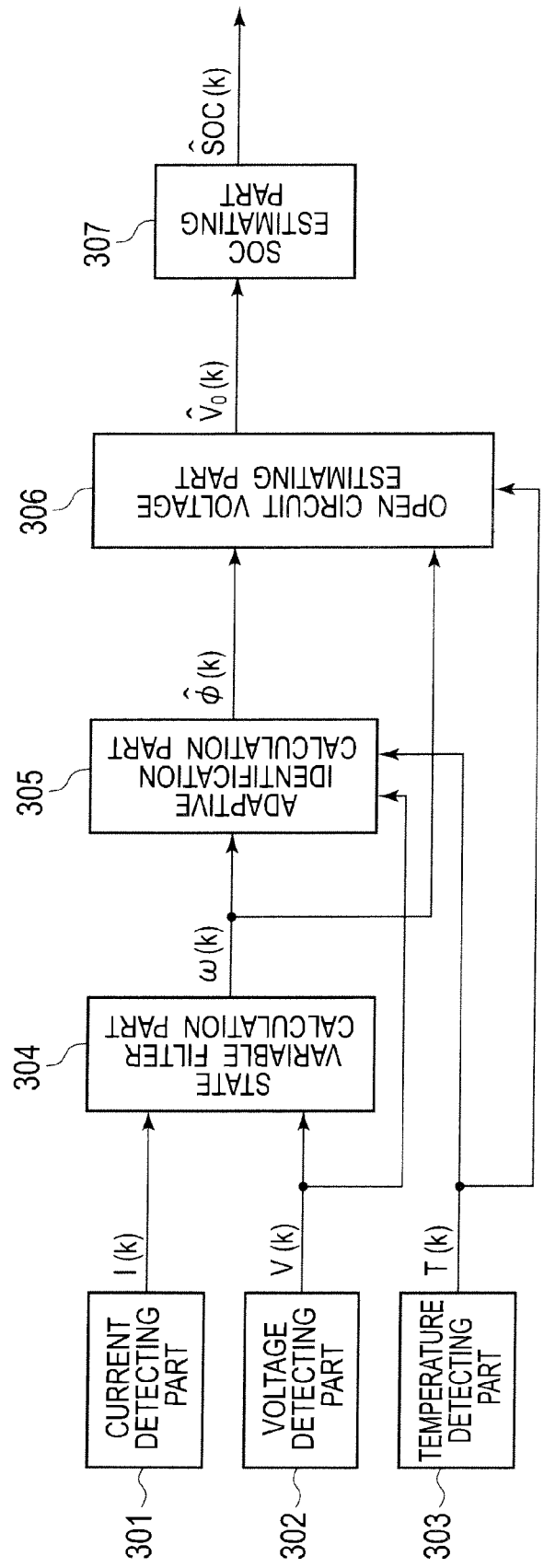
FIG. 2 is a functional block diagram of an electronic control unit 30 shown in FIG. 1.

The electronic control unit 30 is a control unit for controlling the secondary battery 10 and includes a microcomputer, an electronic circuit, and the like, the microcomputer including a CPU configured to execute calculation processing specified in a computer program and ROM and RAM configured to store the computer program and calculation results. FIG. 2 shows a functional block diagram of the electronic control unit 30.

As shown in FIG. 2, the electronic control unit 30 includes a current detecting part 301, a voltage detecting part 302, a temperature detecting part 303, a state variable filter calculation part 304, an adaptive identification calculation part 305, an open circuit voltage estimating part 306, and an SOC estimating part 307.

The current detecting part 301 acquires the signal from the ammeter 40 at predetermined intervals and detects the charge or discharge current flowing through the secondary battery 10, on the basis of the signal from the ammeter 40, to acquire a measured current value I(k). The current detecting part 301 transmits the acquired measured current value I(k) to the state variable filter calculation part 304.

The voltage detecting part 302 acquires the signal from the voltmeter 50 at predetermined intervals and detects the terminal voltage of the secondary battery 10 on the basis of the signal from the voltmeter 50 to acquire a measured voltage value V(k). The voltage detecting part 302 transmits the acquired measured voltage value V(k) to the state variable filter calculation part 304 and the adaptive identification calculation part 305.

The temperature detecting part 303 acquires the signal from the temperature sensor 60 at predetermined intervals and detects the temperature of the secondary battery 10 on the basis of the signal from the temperature sensor 60 to acquire a battery temperature T(k). The temperature detecting part 303 transmits the acquired battery temperature T(k) to the adaptive identification calculation part 305 and the open circuit voltage estimating part 306.

The state variable filter calculation part 304 defines a battery model of the secondary battery 10, performs state variable filter calculation by using the measured current value I(k) detected by the current detecting part 301 and the measured voltage value V(k) detected by the voltage detecting part 302, and thereby obtains a transformed state amount $\omega(k)$.

A method of calculating the transformed state amount $\omega(k)$ which is performed by the state variable filter calculation part 304 is described below.

Figure 3:
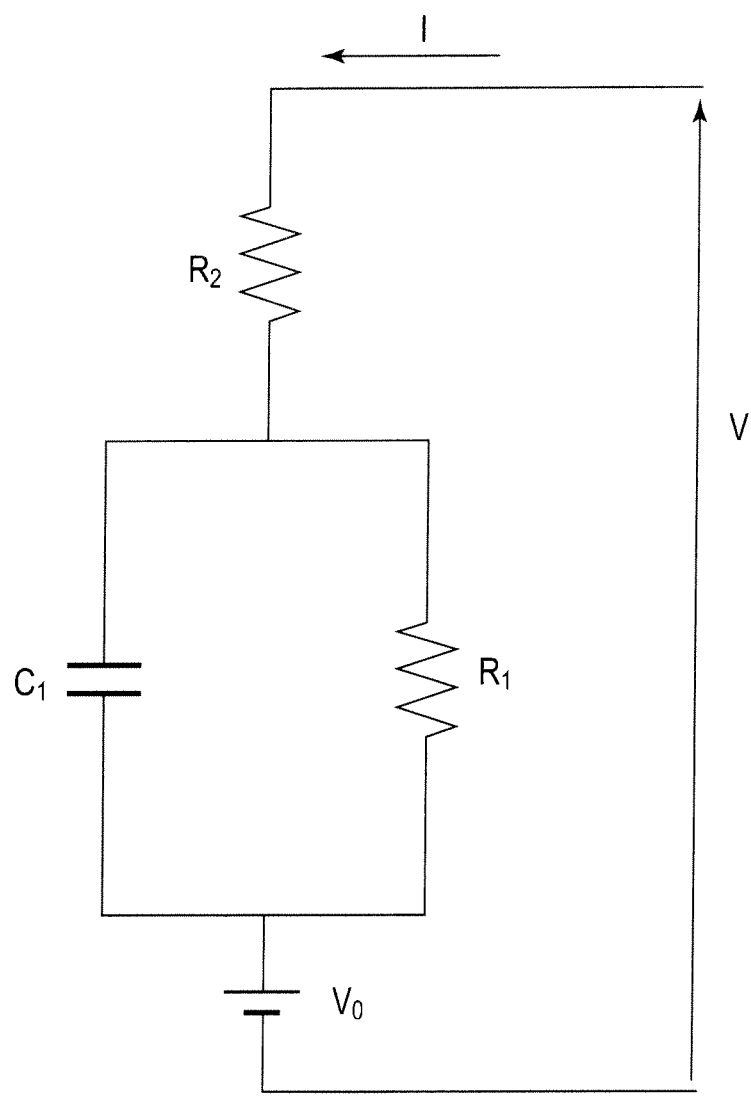
FIG. 3 is a diagram showing an equivalent circuit model illustrating a battery model of the secondary battery shown in FIG. 1.

First, the "battery model" used in the embodiment is described. FIG. 3 is an equivalent circuit model showing the battery model of the secondary battery 10. The equivalent circuit model shown in FIG. 3 is expressed in Formula (1) shown below.

[Formula 1]

$$V(t) = \frac{C_1 \cdot R_1 \cdot R_2 \cdot s + R_1 + R_2}{C_1 \cdot R_1 \cdot s + 1} \cdot I(t) + V_0(t) \quad (1)$$

In this formula, a model input is a current I [A] and a model output is a terminal voltage V [V]. Moreover, $R_1$ [Ω] is a charge transfer resistance, $R_2$ [Ω] is a pure resistance, $C_1$ [F] is an electrical double-layer capacitance, $V_0$ [V] is an open circuit voltage. The current I [A] being a positive value indicates charge and the current I [A] being a negative value indicates discharge. Moreover, s in Formula (1) shown above is a differential operator. Although the battery model of the embodiment is a reduction model (linear function) in which a positive electrode and a negative electrode are not particularly separated from each other, the battery model can relatively accurately show the actual charge and discharge characteristics of the battery. As described above, in the embodiment, description is given of an example of a configuration in which the degree of the battery model is one. The degree of the battery model may be two or more.

When $R_1$, $R_2$, and $C_1$ are expressed as in Formula (2) shown below, Formula (1) shown above is expressed as in Formula (3) shown below.

[Formula 2]

$$K = R_1 + R_2, \quad (2)$$
$$T_1 = C_1 \cdot R_1,$$
$$T_2 = \frac{C_1 \cdot R_1 \cdot R_2}{R_1 + R_2}$$

[Formula 3]

$$V(t) = \frac{K \cdot (T_2 \cdot s + 1)}{T_1 \cdot s + 1} \cdot I(t) + V_0(t) \quad (3)$$

Then, in the embodiment, the state variable filter calculation part 304 performs the state variable filter calculation on the basis of the battery model expressed in Formula (3) shown above to obtain the transformed state amount $\omega(k)$.

First, assuming that the open circuit voltage $V_0(t)$ is a value obtained by integrating a certain value, which is obtained by multiplying the current I(t) by a variable parameter h, from a certain initial state, the open circuit voltage $V0(t)$ can be expressed by Formula (4) shown below.

[Formula 4]

$$V_0(t) = \frac{h}{s} \cdot I(t) \quad (4)$$

Subsequently, Formula (4) shown above is substituted into Formula (3) shown above and Formula (5) shown below is thereby obtained. Formula (5) is then simplified to Formula (6) shown below.

[Formula 5]

$$V(t) = \frac{K \cdot (T_2 \cdot s + 1)}{T_1 \cdot s + 1} \cdot I(t) + \frac{h}{s} \cdot I(t) \quad (5)$$

[Formula 6]

$$V(t) = \frac{K \cdot T_2 \cdot s^2 + (K + T_1 \cdot h) \cdot s + h}{T_1 \cdot s^2 + s} \cdot I(t) \quad (6)$$

Formula (6) shown above corresponds to a formula where degrees of A(s) and B(s) are respectively one and two in Formula (7) shown below.

[Formula 7]

$$V(t) = \frac{B(s)}{s \cdot A(s)} \cdot I(t) \quad (7)$$

In this formula, A(s) and B(s) are polynomial functions of s.

In Formula (6) shown above, $(T_1 \cdot s^2 + s)$ being the denominator on the right side corresponds to $s \cdot A(s)$ of Formula (7) shown above and Formula (8) shown below is obtained by dividing the denominator and the numerator on the right side of Formula (6) shown above by $T_1$ being the coefficient of a term with the highest degree in $(T_1 \cdot s^2+s)$. Note that Formula (8) shown below is a formula where the coefficient of $s^2$ being the term with the highest degree in the denominator on the right side of Formula (6) shown above is one.

[Formula 8]

$$V(t) = \frac{\frac{K \cdot T_2}{T_1} \cdot s^2 + \left(\frac{K}{T_1} + h\right) \cdot s + \frac{h}{T_1}}{s^2 + \frac{1}{T_1} \cdot s} \cdot I(t) \qquad (8)$$

When $T_1$ being an unknown parameter is the coefficient of $s^2$ being the term with the highest degree in the denominator on the right side as in Formula (6) shown above, there may be a case where $T_1$ being the unknown parameter is calculated to be a value close to zero in an identification step of the unknown parameter to be described later. In such a case, the degree of the denominator on the right side of Formula (6) shown above may change. When the degree of the denominator on the right side of Formula (6) changes, the following problems may occur. A delay in identification of unknown parameter to be described later occurs or the unknown parameter does not converge to a true value after the identification calculation. In the embodiment, the denominator and the numerator on the right side of Formula (6) shown above are divided by $T_1$ and Formula (8) shown above is thereby obtained to effectively prevent the problems described above.

Then, a known fixed number $k_i$ (i=1, 2, . . . , n) is introduced into Formula (8) shown above and Formulae (9) and (10) shown below can be thereby obtained.

[Formula 9]

$$f_{Vi}(t) = \frac{s^{2-i}}{s^2 + k_1 \cdot s + k_2} \cdot V(t) \\ f_{Ii}(t) = \frac{s^{2-i}}{s^2 + k_1 \cdot s + k_2} \cdot I(t) \qquad (9)$$

[Formula 10]

$$y(t) = \sum_{i=1}^{2} \{I_i f_{Vi}(t) + b_{0i} f_{Ii}(t)\} = [\,I_i \quad b_{0i}\,] \cdot \begin{bmatrix} f_{Vi} \\ f_{Ii} \end{bmatrix} \qquad (10)$$

In Formula (10) shown above, y(t) is a value obtained by subtracting a direct feedthrough term from V(t). Accordingly, y(t) is expressed by Formula (11) shown below.

[Formula 11]

$$y(t) = V(t) - \frac{K \cdot T_2}{T_1} \cdot I(t) \qquad (11)$$

In Formula (10) shown above, $I_i$ and $b_{0i}$ are parameters including unknown parameters ($T_1$, $T_2$, K, h) and $f_{Vi}$ and $f_{Ii}$ are transformed state amounts obtained by subjecting I(k) and V(k), which are values measurable by the ammeter 40 and the voltmeter 50, to filter processing using the state variable filter. Since Formula (10) shown above is a formula of a sum of products of $I_i$, $b_{0i}$, $f_{Vi}$, and $f_{Ii}$, Formula (10) coincides with Formula (12) shown below being a normal form of an adaptive digital filter.

[Formula 12]

$$y(t) = \phi^T \omega \qquad (12)$$

Note that, in Formula (12) shown above, $\phi^T=[I_i, b_{0i}]$ and $\omega^T=[f_{Vi}, f_{Ii}]$ are satisfied.

The transformed state amount ω(k) is thus calculated by the state variable filter calculation part 304. The state variable filter calculation part 304 then transmits the obtained transformed state amount ω(k) to the adaptive identification calculation part 305 and the open circuit voltage estimating part 306.

The adaptive identification calculation part 305 performs adaptive digital filter calculation on the basis of the transformed state amount ω(k) calculated by the state variable filter calculation part 304 and thereby performs the identification calculation of identifying parameters $\hat{\phi}(k)$ of the battery model of the secondary battery 10.

Note that "^" attached to an upper right portion in $\hat{\phi}(k)$ indicates that the value to which "^" attached is an estimate value. Moreover, although "^" indicating the estimate values are provided directly above "φ" of φ(k), "V" of $V_0(k)$, and "S" of SOC(k) in FIG. 2, these have the same meaning as $\hat{\phi}(k)$, $\hat{V}_0(k)$, and $\widehat{SOC}(k)$ as shown in Formula (13) shown below. This is the same hereafter also for $\hat{V}(k)$.

[Formula 13]

$$\hat{\phi}(k) = \hat{\phi}(k)$$

$$\hat{V}_0(k) = \hat{V}_0(k)$$

$$\widehat{SOC}(k) = \widehat{SOC}(k) \qquad (13)$$

Figure 4:
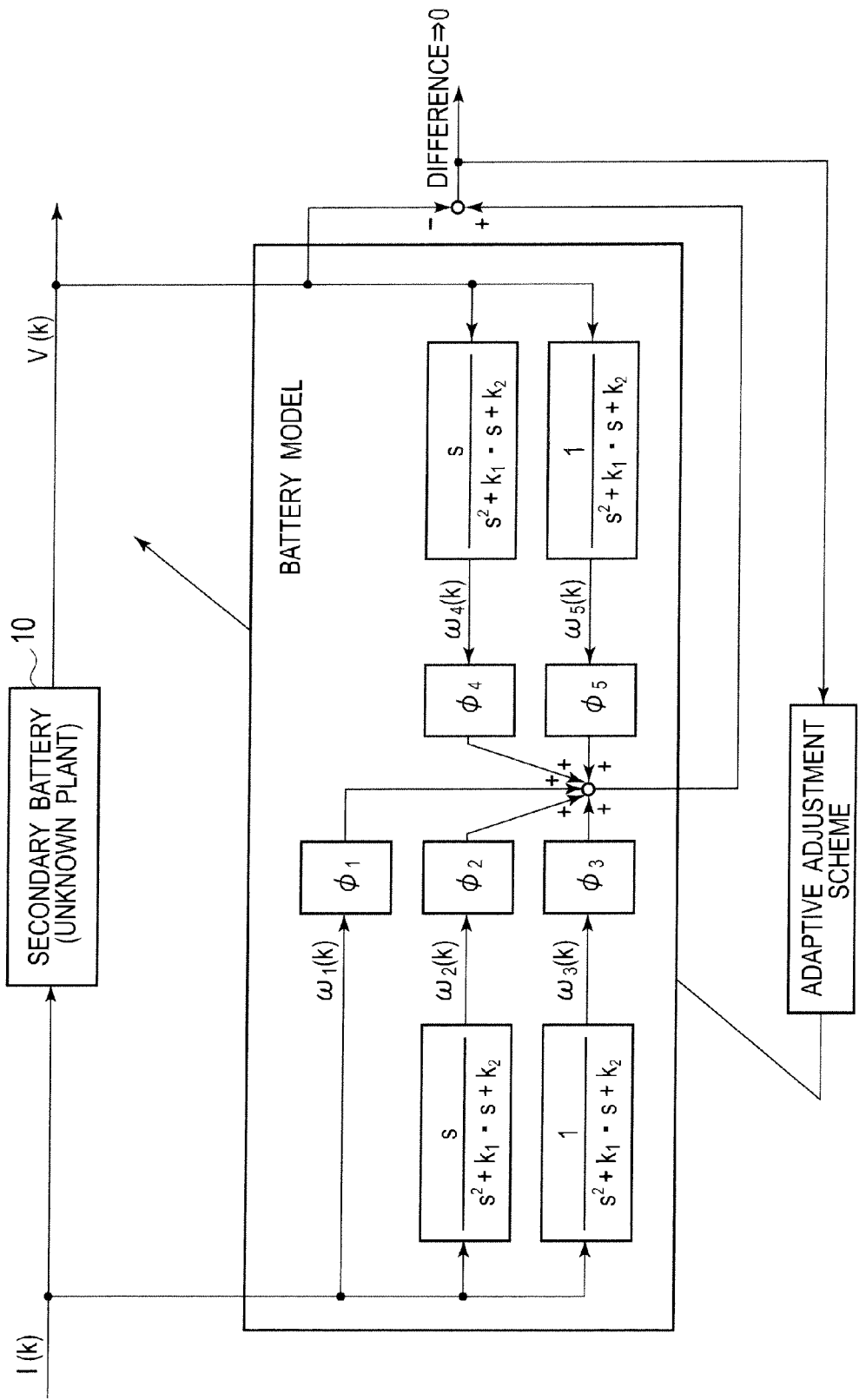
FIG. 4 is a configuration diagram of an adaptive identification system in the embodiment.

Specifically, in a configuration diagram of an adaptive identification system shown in FIG. 4, the adaptive identification calculation part 305 first estimates an estimated voltage value $\hat{V}(k)$ from the transformed state amount ω(k), the estimated voltage value $\hat{V}(k)$ being an estimate value of the terminal voltage of the secondary battery 10 which is estimated from the battery model described above. Then, the adaptive identification calculation part 305 performs the identification calculation of identifying the parameter $\hat{\phi}(k)$ of the battery model on the basis of an algorithm shown in Formula (14) shown below, by using an adaptive adjustment scheme. In the identification calculation, the adaptive identification calculation part 305 performs the identification calculation in such a way that the difference between the estimated voltage value $\hat{V}(k)$ and the measured voltage value V(k) being an actual measured value which is detected by the voltmeter 50 and acquired by the voltage detecting part 302 converges to zero. In the embodiment, "both-limit trace gain method" in which logical disadvantages of a simple "adaptive digital filter using a least squares method" are improved may be used in the calculation. The following point can be given as an example of the logical disadvantages. Once the estimate value converges, accurate estimation cannot be performed again when the parameters change after the convergence. Note that FIG. 4 is the configuration diagram of the adaptive identification system of the embodiment which is implemented by the state variable filter calculation part 304 and the adaptive identification calculation part 305.

[Formula 14]

$$\hat{\varphi}(k) = \hat{\phi}(k-1) - \gamma(k) \cdot \Gamma(k-1) \cdot \omega(k) \cdot e(k)$$
$$e(k) = \hat{V}(k) - V(k)$$
$$\hat{V}(k) = \omega^T(k) \cdot \hat{\phi}(k-1)$$

(14)

Formula (14) shown above is a sequential formula for adaptively obtaining the parameter $\hat{\phi}(k)$. Furthermore, $\gamma(k)$ and $\Gamma(k-1)$ are both adaptive gains. Out of these, $\gamma(k)$ is a scalar gain (error gain) and $\Gamma(k-1)$ is a matrix gain (signal gain). When the transformed state amount $\omega(k)$ at a time point k is obtained, e(k) can be obtained from Formula (14) shown above, e(k) being the difference between the estimated voltage value $\hat{V}(k)$ being the estimate value of the terminal voltage of the secondary battery 10 which is estimated from the battery model and the measured voltage value V(k) detected by the voltmeter 50 and acquired by the voltage detecting part 302. Then, converging e(k) to zero allows the parameter $\hat{\phi}(k)$ to be sequentially calculated by using the parameter $\hat{\phi}(k-1)$ and the matrix gain $\Gamma(k-1)$ which are obtained in the previous processing. In this case, it is possible to subject the value acquired by the voltage detecting part 302 to filter processing for removal of measurement noise and to use the resultant value as the measured voltage value V(k). In such a case, the estimated voltage value taking filter characteristics into consideration is calculated.

The parameter $\hat{\phi}(k)$ of the secondary battery 10 which is calculated as described above is transmitted from the adaptive identification calculation part 305 to the open circuit voltage estimating part 306 as shown in FIG. 2.

Then, as shown in FIG. 4, in the adaptive identification system of the embodiment implemented by the state variable filter calculation part 304 and the adaptive identification calculation part 305, the state variable filter calculation part 304 first calculates the transformed state amount $\omega(k)$ by using the state variable filter as described above, on the basis of the measured current value I(k) detected by the current detecting part 301 and the measured voltage value V(k) detected by the voltage detecting part 302. In the example shown in FIG. 4, the transformed state amount $\omega(k)$ includes $\omega_1(k)$, $\omega_2(k)$, $\omega_3(k)$, $\omega_4(k)$, and $\omega_5(k)$.

Subsequently, the adaptive identification calculation part 305 calculates the estimated voltage value $\hat{V}(k)$ being the estimate value of the terminal voltage which is based on the battery model, on the basis of the transformed state amount $\omega(k)$ obtained by the state variable filter calculation part 304 and the parameter $\hat{\phi}(k-1)$ of the battery model. Then, in the adaptive identification system of the embodiment, the adaptive identification calculation part 305 performs the sequential identification of the parameter $\hat{\phi}(k)$ of the battery model in accordance with Formula (14) shown above, by using the transformed state amount $\omega(k)$ obtained by the state variable filter calculation part 304, the measured voltage value V(k) detected by the voltage detecting part 302, and the estimated voltage value $\hat{V}(k)$. Note that the parameter $\hat{\phi}(k)$ of the battery model is generally a parameter vector including multiple parameters. In the example shown in FIG. 4, the parameter $\hat{\phi}(k)$ of the battery model includes parameters $\phi_1$, $\phi_2$, $\phi_3$, $\phi_4$, and $\phi_5$.

When $T_1$ being the coefficient of the term with the highest degree in $(T_1 \cdot s^2 + s)$ being the denominator on the right side of Formula (6) shown above is expressed by using the parameter $\hat{\phi}(k)$ of the battery model which is identified by the adaptive identification calculation part 305, Formula (15) shown below is obtained.

[Formula 15]

$$T_1 = \frac{1}{\alpha - \phi_n}$$

(15)

In Formula (15) shown above, $\phi_n$ is a highest-degree term parameter corresponding to $T_1$ being the coefficient of the term with the highest degree in $(T_1 \cdot s^2 + s)$ being the denominator on the right side of Formula (6) shown above, among the parameters included in the parameter $\hat{\phi}(k)$ of the battery model. In other words, the highest-degree term parameter $\phi_n$ is a parameter corresponding to $T_1$ in the parameter $\hat{\phi}(k)$ of the battery model which is identified by the adaptive identification calculation part 305. Moreover, $\alpha$ is a value determined depending on a cutoff frequency $\lambda$ of the state variable filter.

Then, the adaptive identification calculation part 305 determines whether the highest-degree term parameter $\phi_n$ corresponding to $T_1$ being the coefficient of the term with the highest degree is equal to or larger than an initialize determination threshold $\delta 2$. In other words, the adaptive identification calculation part 305 determines whether the condition of "$\phi_n \geq \delta 2$" is satisfied. Here, the initialize determination threshold $\delta 2$ is a threshold for determining whether the identification calculation of the parameter $\hat{\phi}(k)$ of the battery model which is performed by the adaptive identification calculation part 305 is to be initialized. The initialize determination threshold $\delta 2$ is calculated from the battery temperature T(k) detected by the temperature detecting part 303, by using a table which is stored in advance in the ROM included in the electronic control unit 30 and which shows the relationship between the battery temperature and the initialize determination threshold $\delta 2$. Moreover, the initialize determination threshold $\delta 2$ is set to a value larger than an upper-limit determination threshold $\delta 1$ to be described later. In other words, "initialize determination threshold $\delta 2$>upper-limit determination threshold $\delta 1$" is satisfied.

When the adaptive identification calculation part 305 determines whether the condition of "$\phi_n \geq \delta 2$" is satisfied and consequently determines that the condition of "$\phi_n \geq \delta 2$" is satisfied, it is judged that the value of the parameter $\hat{\phi}(k)$ identified in the sequential identification calculation using Formula (14) shown above greatly changes and the identified parameter $\hat{\phi}(k)$ thereby greatly deviates from the true value. Hence, initialization processing of the identification calculation is performed. Specifically, when the condition of "$\phi_n \geq \delta 2$" is satisfied, the adaptive identification calculation part 305 sets the parameter $\hat{\phi}(k-1)$ and the matrix gain $\Gamma(k-1)$ which are used in the next calculation respectively to a parameter initial value $\phi_i$ and a matrix gain initial value $\Gamma_i$, upon performing the sequential identification calculation by using Formula (14) shown above. Such initialization processing allows the parameter $\hat{\phi}(k)$ to be set close to the true value again in a relatively short time even when the identified parameter $\hat{\phi}(k)$ greatly deviates from the true value.

The open circuit voltage estimating part 306 estimates the open circuit voltage of the secondary battery 10 on the basis of the transformed state amount $\omega(k)$ obtained by the state variable filter calculation part 304 and the parameter $\hat{\phi}(k)$ obtained by the adaptive identification calculation part 305, and thereby calculates the estimate open circuit voltage value $\hat{V}_0(k)$.

Specifically, the open circuit voltage estimating part 306 calculates Formula (16) shown below on the basis of Formula (3) shown above and calculates the estimate open circuit voltage value $V_0\hat{}(k)$ from Formula (16) shown below, by using the parameter $\phi\hat{}(k)$ calculated from Formula (14) shown above, the transformed state amount $\omega(k)$ calculated based on Formula (10) shown above, and the cutoff frequency $\lambda$ of the state variable filter.

[Formula 16]

$$V_0 = \frac{1}{\alpha - \phi_n} \cdot H(\phi, \omega, \lambda) \quad (16)$$

In Formula (16) shown above, $\phi_n$ is the highest-degree term parameter corresponding to $T_1$ being the coefficient of the term with the highest degree. Moreover, $\alpha$ is a value determined depending on the cutoff frequency $\lambda$ of the state variable filter.

Furthermore, the open circuit voltage estimating part 306 determines whether the highest-degree term parameter $\phi_n$ corresponding to $T_1$ being the coefficient of the term with the highest degree is equal to or larger than the upper-limit determination threshold $\delta 1$. In other words, the open circuit voltage estimating part 306 determines whether the condition of "$\phi_n \geq \delta 1$" is satisfied. Here, the upper-limit determination threshold $\delta 1$ is an upper limit value of the highest-degree term parameter $\phi_n$ which is used when the estimate open circuit voltage value $V_0\hat{}(k)$ is calculated by the open circuit voltage estimating part 306. The upper-limit determination threshold $\delta 1$ is calculated from the battery temperature $T(k)$ detected by the temperature detecting part 303, by using a table which is stored in advance in the ROM included in the electronic control unit 30 and which shows the relationship between the battery temperature and the upper-limit determination threshold $\delta 1$.

When the open circuit voltage estimating part 306 determines whether the condition of "$\phi_n \geq \delta 1$" is satisfied and consequently determines that the condition of "$\phi_n \geq \delta 1$" is satisfied, the open circuit voltage estimating part 306 performs upper limit processing of setting the value of the highest-degree term parameter $\phi_n$ to a value equal to $\delta 1$ (hereafter, this value will be referred to as upper limit value $\phi_{n\_LIM}$). Then, upon calculating the estimate open circuit voltage value $V_0\hat{}(k)$ from Formula (16), the open circuit voltage estimating part 306 uses the value subjected to upper limit processing (upper limit value $\phi_{n\_LIM}$) as the highest-degree term parameter $\phi_n$.

In the calculation, when the highest-degree term parameter $\phi_n$ becomes a value close to the value $\alpha$ determined depending on the cutoff frequency $\lambda$ of the state variable filter in Formula (16) shown above, ($\alpha - \phi_n$) being a component of the denominator of Formula (16) shown above becomes close to zero. Consequently, the identification error of the highest-degree term parameter $\phi_n$ largely affects the estimation error of the estimate open circuit voltage value $V_0\hat{}(k)$. In the embodiment, such a problem is effectively solved by setting the upper limit value $\phi_{n\_LIM}$ of the highest-degree term parameter $\phi_n$ in the calculation of the estimate open circuit voltage value $V_0\hat{}(k)$ from Formula (16) shown above and by performing the upper limit processing of setting the highest-degree term parameter $\phi_n$ to the upper limit value $\phi_{n\_LIM}$ when the highest-degree term parameter $\phi_n$ becomes equal to or larger than the upper limit value $\phi_{n\_LIM}$.

The open circuit voltage estimating part 306 can calculate the unknown parameters ($T_1$, $T_2$, K, and h) in addition to the estimate open circuit voltage value $V_0\hat{}(k)$ from Formula (16) shown above.

Figure 5:
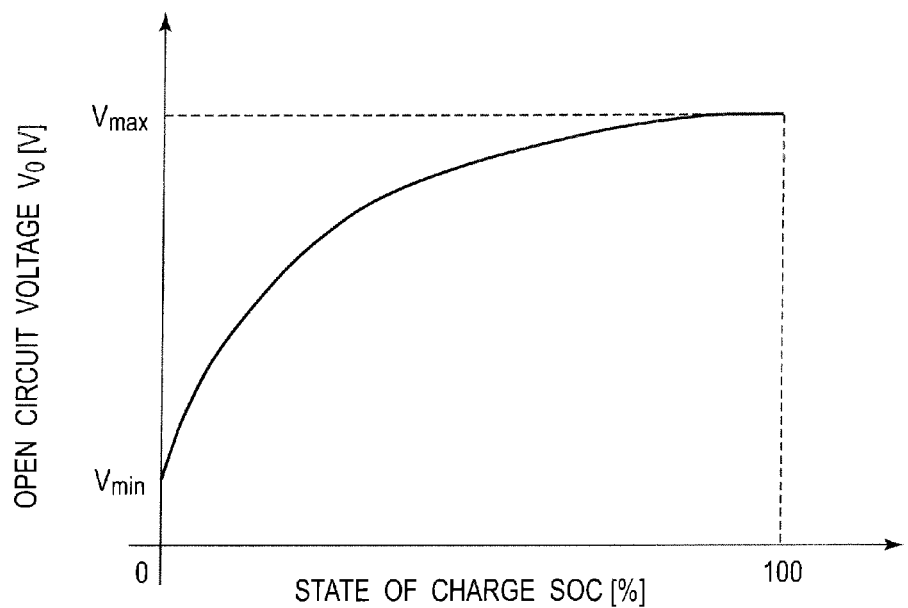
FIG. 5 is a graph showing an example of an open circuit voltage-state of charge characteristic of the secondary battery.

The SOC estimating part 307 calculates an estimate state-of-charge value $SOC\hat{}(k)$ from the estimate open circuit voltage value $V_0\hat{}(k)$ calculated by the open circuit voltage estimating part 306, on the basis of a predetermined open circuit voltage-state of charge characteristic of the secondary battery 10. FIG. 5 shows an example of the open circuit voltage-state of charge characteristic of the secondary battery 10. In the embodiment, the open circuit voltage-state of charge characteristic of the secondary battery 10 is stored in the ROM included in the electronic control unit 30 in advance and can be acquired for the secondary battery 10 by obtaining the relationship between the open voltage and the state of charge through experiments in advance.

Figure 6:
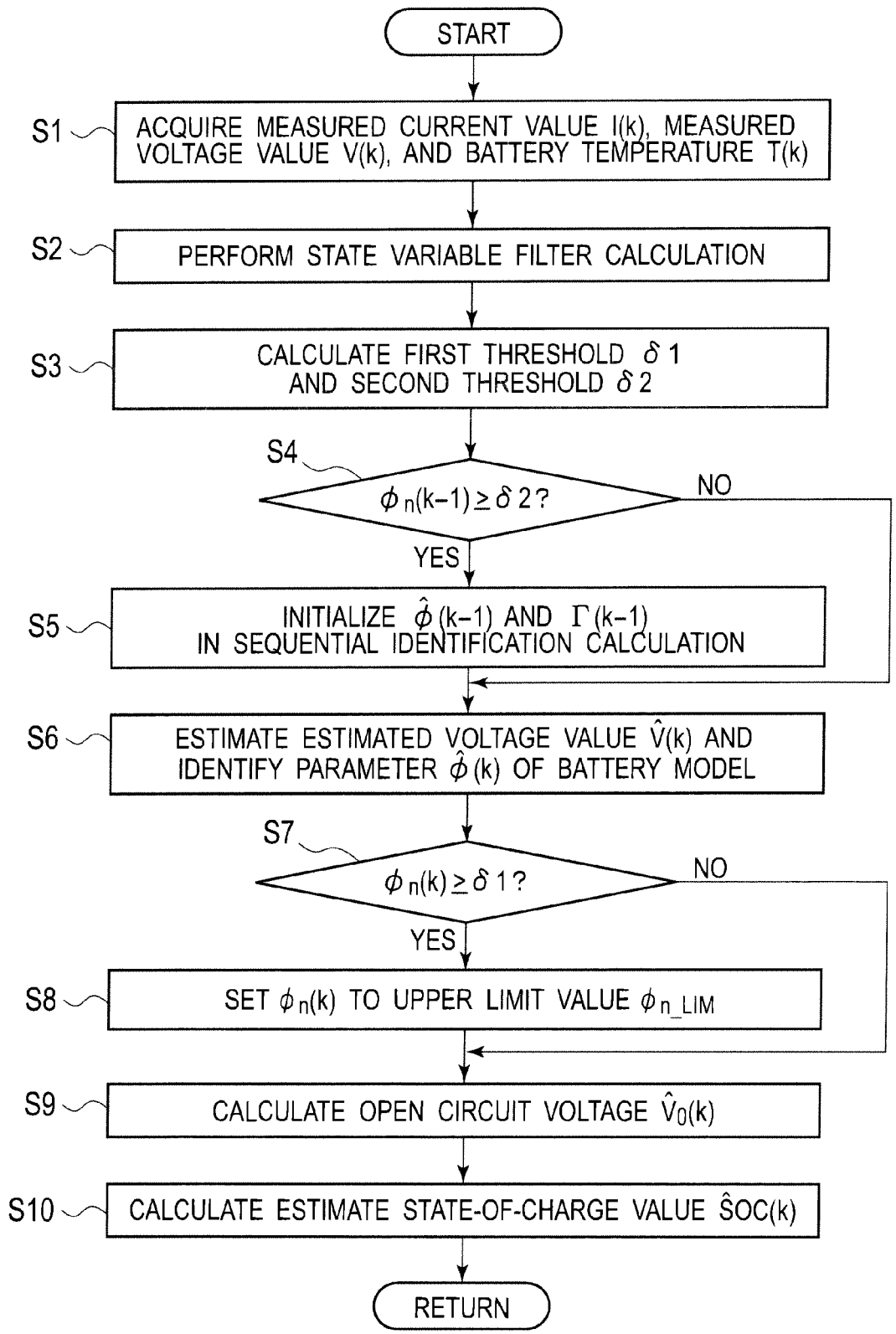
FIG. 6 is a flowchart showing an example of estimation processing of a parameter and a state of charge of the battery model in the embodiment.

Next, estimation processing of the parameter $\phi\hat{}(k)$ and the estimate state-of-charge value $SOC\hat{}(k)$ in the embodiment is described by using the flowchart shown in FIG. 6. The processing shown in FIG. 6 is performed at regular cycles (every 100 msec in the embodiment). In the description below, I(k) refers to the current value in the latest execution cycle (latest measured value) and I(k−1) refers to the current value in the execution cycle one before the latest execution cycle (previous measured value). Values other than those of the current will be noted similarly. The processing described below is performed by the electronic control unit 30.

In Step S1, the current detecting part 301, the voltage detecting part 302, and the temperature detecting part 303 acquire the measured current value I(k), the measured voltage value V(k), and the battery temperature T(k), respectively. Then, the measured current value I(k) is transmitted to the state variable filter calculation part 304, the measured voltage value V(k) is transmitted to the state variable filter calculation part 304 and the adaptive identification calculation part 305, and the battery temperature T(k) is transmitted to the adaptive identification calculation part 305 and the open circuit voltage estimating part 306.

In Step S2, the state variable filter calculation part 304 performs the state variable filter calculation using the state variable filter on the basis of Formulae (9) and (10) shown above, for the measured current value I(k) and the measured voltage value V(k) which are acquired in Step S1. The transformed state amount $\omega(k)$ is thereby calculated.

In Step S3, the calculation of the upper-limit determination threshold $\delta 1$ and the initialize determination threshold $\delta 2$ is performed based on the battery temperature T(k) acquired in Step S1. Specifically, the upper-limit determination threshold $\delta 1$ is calculated by the open circuit voltage estimating part 306 from the battery temperature T(k) acquired in Step S1, by using the table which is stored in advance in the ROM included in the electronic control unit 30 and which shows the relationship between the battery temperature and the upper-limit determination threshold $\delta 1$. Moreover, the initialize determination threshold $\delta 2$ is calculated by the adaptive identification calculation part 305 from the battery temperature T(k) acquired in Step S1, by using the table which is stored in advance in the ROM included in the electronic control unit 30 and which shows the relationship between the battery temperature and the initialize determination threshold $\delta 2$.

In a secondary battery such as a lithium-ion secondary battery, a diffusion resistance (corresponding to the charge transfer resistance $R_1$) tends to become larger as the battery temperature T(k) becomes lower. Accordingly, $T_1$ being the coefficient of the term with the highest degree tends to be calculated as a larger value as the battery temperature T(k) becomes lower (see Formula (2) shown above). From Formulae (15) and (16) shown above, the fact that $T_1$ being the coefficient of the term with the highest degree tends to be calculated as a larger value means that $(\alpha-\phi_n)$ being a component of the denominator in Formulae (15) and (16) shown above tends to be calculated as a value close to zero. To counter this, in the embodiment, the lower the battery temperature T(k) is, the larger the values of the upper-limit determination threshold $\delta 1$ and the initialize determination threshold $\delta 2$ are set. In other words, the upper-limit determination threshold $\delta 1$ and the initialize determination threshold $\delta 2$ are set to values close to the value $\alpha$ determined depending on the cutoff frequency $\lambda$ of the state variable filter. This enables the later-described initialization processing in Step S5 and the later-described upper limit processing in Step S8 to be performed properly depending on the battery temperature T(k). Excellent identification accuracy of the parameter $\phi\hat{}(k)$ and excellent estimation accuracy of the estimate open circuit voltage value $V_0\hat{}(k)$ and the estimate state-of-charge value $SOC\hat{}(k)$ are thereby achieved.

In Step S4, the adaptive identification calculation part 305 determines whether the highest-degree term parameter $\phi_n(k-1)$ among the parameters included in the parameter $\phi\hat{}(k-1)$ calculated in Step S6 of the previous processing is equal to or larger than the initialize determination threshold $\delta 2$ calculated in Step S3. In other words, in Step S4, determination of whether "$\phi_n(k-1) \geq \delta 2$" is satisfied is performed. When "$\phi_n(k-1) \geq \delta 2$" is satisfied, the processing proceeds to Step S5. Meanwhile, when "$\phi_n(k-1) \geq \delta 2$" is not satisfied, the processing proceeds to Step S6.

When the adaptive identification calculation part 305 determines that "$\phi_n(k-1) \geq \delta 2$" is satisfied in Step S4, the processing proceeds to Step S5. In Step S5, the adaptive identification calculation part 305 performs the initialization processing in which the value of the parameter $\phi\hat{}(k-1)$ and the value of the matrix gain $\Gamma(k-1)$ which are used in the identification calculation performed based on Formula (14) shown above are set respectively to the predetermined parameter initial value $\phi_i$ and the predetermined matrix gain initial value $\Gamma_i$.

In Step S6, the adaptive identification calculation part 305 performs the identification calculation processing for identifying the parameter $\phi\hat{}(k)$ of the battery model. Specifically, the adaptive identification calculation part 305 first estimates the estimated voltage value $V\hat{}(k)$ of the secondary battery 10 which is estimated from the battery model, from the transformed state amount $\omega(k)$ calculated in Step S2. Then, the adaptive identification calculation part 305 performs the identification calculation of identifying the parameter $\phi\hat{}(k)$ of the battery model on the basis of the algorithm shown in Formula (14) shown above, by using the adaptive adjustment scheme. In this case, the adaptive identification calculation part 305 performs the identification calculation described above in such a way that the difference between the estimated voltage value $V\hat{}(k)$ and the measured voltage value V(k) being the actual measured value detected by the voltmeter 50 and acquired by the voltage detecting part 302 converges to zero. Note that, when the parameter $\phi\hat{}(k-1)$ and the matrix gain $\Gamma(k-1)$ are set respectively to the parameter initial value $\phi_i$ and the matrix gain initial value $\Gamma_i$ in Step S5, the calculation of the parameter $\phi\hat{}(k)$ of the battery model is performed by using these initial values. Then, the parameter $\phi\hat{}(k)$ of the battery model which is calculated by the adaptive identification calculation part 305 is transmitted to the open circuit voltage estimating part 306.

In Step S7, the open circuit voltage estimating part 306 determines whether the highest-degree term parameter $\phi_n(k)$ among the parameters included in the parameter $\phi\hat{}(k)$ of the battery model which is calculated in Step S6 of the latest processing is equal to or larger than the upper-limit determination threshold $\delta 1$ calculated in Step S3. In other words, in Step S7, determination of whether "$\phi_n(k) \geq \delta 1$" is satisfied is performed. When "$\phi_n(k) \geq \delta 1$" is satisfied, the processing proceeds to Step S8. Meanwhile, when "$\phi_n(k) \geq \delta 1$" is not satisfied, the processing proceeds to Step S9.

When the open circuit voltage estimating part 306 determines that "$\phi_n(k) \geq \delta 1$" is satisfied is Step S7, the processing proceeds to Step S8. In Step S8, the open circuit voltage estimating part 306 performs the upper limit processing of setting the value of the highest-degree term parameter $\phi_n$ to the value equal to $\delta 1$, i.e. the upper limit value $\phi_{n\_LIM}$.

Next, in Step S9, the open circuit voltage estimating part 306 calculates the estimate open circuit voltage value $V_0\hat{}(k)$ on the basis of Formula (16) shown above, by using the parameter $\phi\hat{}(k)$ of the battery model calculated in Step S6, the transformed state amount $\omega(k)$ calculated in Step S2, and the cutoff frequency $\lambda$ of the state variable filter. In the calculation of the estimate open circuit voltage value $V_0\hat{}(k)$, when the upper limit processing of setting the value of the highest-degree term parameter $\phi_n$ to the upper limit value $\phi_{n\_LIM}$ is performed in Step S8 described above, the upper limit value $\phi_{n\_LIM}$ is used as the highest-degree term parameter $\phi_n$. Then, the calculated estimate open circuit voltage value $V_0\hat{}(k)$ is transmitted to the SOC estimating part 307.

In Step S10, the SOC estimating part 307 performs the calculation of the estimate state-of-charge value $SOC\hat{}(k)$ on the basis of the predetermined open circuit voltage-state of charge characteristic of the secondary battery 10, by using the estimate open circuit voltage value $V_0\hat{}(k)$ calculated in Step S9. Thereafter, the processing returns to Step S1. The processing of Step S1 to Step S10 described above is then repeated and the identification processing of the parameter $\phi\hat{}(k)$ of the battery model and the estimation identification processing of the estimate state-of-charge value $SOC\hat{}(k)$ which is based on the parameter $\phi\hat{}(k)$ are thereby repeatedly performed.

In the embodiment, when the highest-degree term parameter $\phi_n$ corresponding to $T_1$ being the coefficient of the term with the highest degree in $(T_1 \cdot s^2 + s)$ being the denominator on the right side of Formula (6) shown above in the parameter $\phi\hat{}(k)$ of the battery model is equal to or larger than the upper-limit determination threshold $\delta 1$, the upper limit processing of setting the value of the highest-degree term parameter $\phi_n$ to the value equal to $\delta 1$ is performed. Then, the estimation of the estimate open circuit voltage value $V_0\hat{}(k)$ is performed according to Formula (16) shown above, by using the value subjected to the upper limit processing as the highest-degree term parameter $\phi_n$. Accordingly, in the embodiment, it is possible to effectively prevent the case where $(\alpha-_n)$ being the component of the denominator in Formula (16) shown above becomes close to zero and the estimation error of the estimate open circuit voltage value $V_0\hat{}(k)$ thereby becomes large. Accordingly, the estimation accuracy of the estimate open circuit voltage value $V_0\hat{}(k)$ and the estimate state-of-charge value $SOC\hat{}(k)$ can be improved.

Moreover, in the embodiment, when the upper limit processing is performed for the highest-degree term parameter $\phi_n$, the value subjected to the upper limit processing is used in the calculation of the estimate open circuit voltage value $V_0\hat{}(k)$ which is performed by the open circuit voltage estimating part 306 as described above. Meanwhile, when the sequential identification calculation is performed according to Formula (14) shown above by the adaptive identification calculation part 305, instead of the value subjected to the upper limit processing, the value identified in the identification calculation processing is used as it is as the highest-degree term parameter $\phi_n(k-1)$ used in the next calculation. In other words, the configuration of the embodiment is such that the value subjected to the upper limit processing is not used when the sequential identification calculation is performed according to Formula (14) shown above by the adaptive identification calculation part 305. Using the value identified in the identification calculation processing as it is instead of the value subjected to upper limit processing in the sequential identification calculation enables the adaptive identification calculation part 305 to perform sequential calculation for the identification of the parameter $\hat{\phi}(k)$ of the battery model in an ideal linear state. Hence, the identification accuracy of the parameter $\hat{\phi}(k)$ of the battery model can be maintained at an excellent level. Particularly, when the value subjected to the upper limit processing is used in the sequential identification calculation performed by the adaptive identification calculation part 305, the non-linear state may occur in some cases. In such a case, there may be a problem of the sequential identification calculation not being performed at an excellent level, such as a problem of the convergence to the true value taking time. Such a problem can be effectively prevented by not using the value subjected to the upper limit processing when the sequential identification calculation is performed according to Formula (14) shown above by the adaptive identification calculation part 305.

Although the embodiment shows an example of the configuration in which, when the sequential identification calculation is performed by the adaptive identification calculation part 305, instead of the value subjected to the upper limit processing, the value identified in the identification calculation processing is used as it is as the highest-degree term parameter $\phi_n(k-1)$, the invention is not particularly limited to this configuration. The configuration may be such that the value subjected to the upper limit processing is used. However, as described above, when there is a possibility of non-linear state occurring due to the use of the value subjected to upper limit processing, the identification accuracy of the parameter $\hat{\phi}(k)$ of the battery model can be improved by using the value identified in the identification calculation processing as it is, instead of the value subjected to the upper limit processing.

Moreover, in the embodiment, when the highest-degree term parameter $\phi_n$ is equal to or larger than the initialize determination threshold $\delta 2$ larger than the upper-limit determination threshold $\delta 1$, it is judged that the value of the parameter $\hat{\phi}(k)$ identified in the sequential identification calculation of the parameter $\hat{\phi}(k)$ of the battery model which is performed by the adaptive identification calculation part 305 greatly changes and the identified parameter $\hat{\phi}(k)$ thereby greatly deviates from the true value. Hence, the adaptive identification calculation part 305 initializes the sequential identification calculation of the parameter $\hat{\phi}(k)$ of the battery model. In the embodiment, this initialization allows the parameter $\hat{\phi}(k)$ to be set close to the true value again in a relatively short time even when the identified parameter $\hat{\phi}(k)$ identified in the sequential identification calculation greatly deviates from the true value. Accordingly, it is possible to effectively prevent the occurrence of such a problem that the state where the identified parameter $\hat{\phi}(k)$ greatly deviates from the true value is maintained once the identified parameter $\hat{\phi}(k)$ greatly deviates from the true value.

Figure 7:
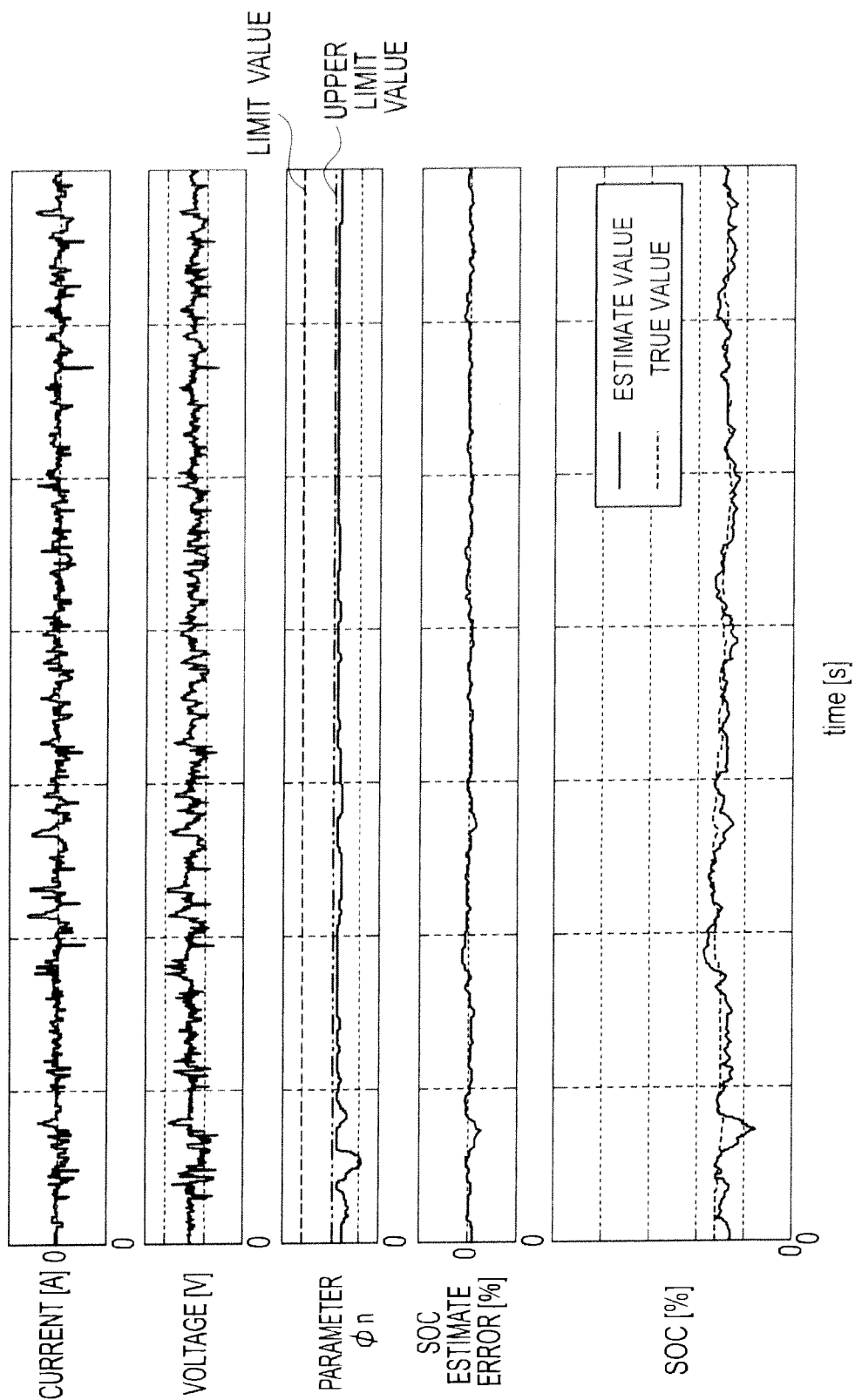
FIG. 7 is a view showing an example of a simulation result of the estimation processing of the state of charge in the embodiment.
Figure 8:
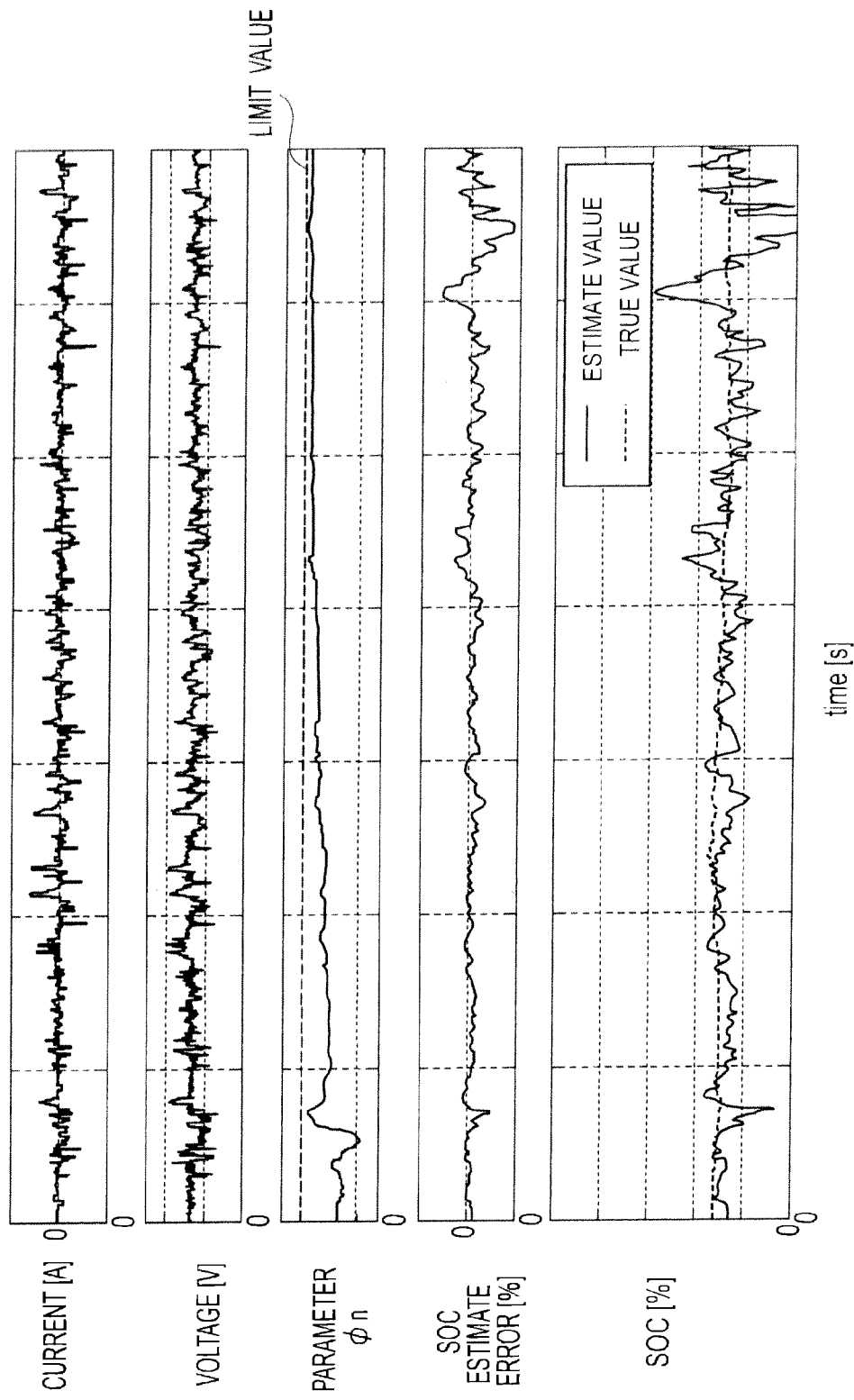
FIG. 8 is a view showing a simulation result of the estimation processing of the state of charge in an art related to the embodiment.

FIG. 7 is a view showing the simulation result of the estimation processing of the state of charge in the embodiment. FIG. 8 is a view showing the simulation result of the estimation processing of the state of charge in the related art.

In each of FIGS. 7 and 8, the graphs are, from above, respectively a profile showing change in the measured current value I(k), a profile showing change in the measured voltage value V(k), a profile showing change in the highest-degree term parameter $\phi_n$, a profile showing change in the error of the estimate value of the state of charge SOC to the true value, and a profile showing change in the state of charge SOC. In the description below, there are shown simulation results obtained with measurement noises superimposed on the current value and the voltage value being the input and output signals of the actual battery. FIG. 7 shows a simulation result of the embodiment in which the highest-degree term parameter $\phi_n$ is set to the upper limit value and FIG. 8 shows a simulation result of the related art in which the highest-degree term parameter $\phi_n$ is not set to the upper limit value. Moreover, in the profile showing the change in the state of charge SOC in each of FIGS. 7 and 8, the estimate value of the state of charge SOC is shown in a solid line and the true value of the state of charge SOC is shown in a broken line. Moreover, in the profile showing change in the highest-degree term parameter $\phi_n$, the limit value, i.e. the value $\alpha$ determined depending on the cutoff frequency $\lambda$ of the state variable filter is shown in a one-dot chain line and the upper limit value is shown in a two-dot chain line.

As shown in FIG. 7, it can be found that setting the upper limit value for the highest-degree term parameter $\phi_n$ as in the embodiment effectively prevents the highest-degree term parameter $\phi_n$ from approaching the limit value and, consequently, the error of the estimate value of the state of charge SOC to the true value can be reduced.

Meanwhile, as shown in FIG. 8, when the upper limit value is not set for the highest-degree term parameter $\phi_n$ unlike the embodiment, the result is such that the highest-degree term parameter $\phi_n$ approaches the limit value and the error of the estimate value of the state of charge SOC to the true value is thereby increased.

In the embodiment described above, the current detecting part 301 corresponds to "current detecting means", the voltage detecting part 302 to "voltage detecting means", the state variable filter calculation part 304 to "identification calculation part" and "identification calculation means", the adaptive identification calculation part 305 to "identification calculation part", "identification calculation means", and "initializing part", and the open circuit voltage estimating part 306 to "open circuit voltage estimating part", "limit processing part", and "limit processing means".

Although the embodiment of the present invention has been described above, this embodiment is described to facilitate the understandings of the present invention and is not described to limit the present invention. Accordingly, the elements disclosed in the embodiment described above are intended to include all of the design changes and equivalents pertaining to the technical scope of the present invention.

For example, in the embodiment described above, the following mode is given as an example. The determination of whether the "$\phi_n(k-1) \geq \delta 2$" is satisfied is performed for the highest-degree term parameter $\phi_n(k-1)$ of the previous processing (Step S4). When "$\phi_n(k-1) \geq \delta 2$" is satisfied, the sequential identification calculation is initialized (Step S5). Thereafter, the identification calculation processing for identifying the parameter φ^(k) of the battery model is performed (Step S6). However, the present invention is not limited to this mode and the following mode may be employed. First, the identification calculation processing for identifying the parameter φ^(k) of the battery model is performed and the determination of whether the "φ_n(k)≥δ2" is satisfied is then performed for the highest-degree term parameter φ_n(k) obtained as a result of the identification calculation processing. In this case, when it is determined that "φ_n(k)≥δ2" is satisfied, the sequential identification processing is initialized and the identification calculation processing for identifying the parameter φ^(k) of the battery model is performed again.

This application claims priority from Japanese Patent Application No. 2010-162738 filed on Jul. 20, 2010 and Japanese Patent Application No. 2011-153665 filed on Jul. 12, 2011, the contents of which are incorporated herein by reference in its entirety.

INDUSTRIAL APPLICABILITY

The battery state estimating device and the battery state estimating method of the embodiment of the present invention estimate the terminal voltage of the secondary battery which is based on the predetermined battery model, by using the measured values of the current and the terminal voltage of the secondary battery, and sequentially identify the parameters of the battery model in such a way that the difference between the value based on the measured value of the terminal voltage and the estimate value of the terminal voltage converges to zero. When the certain parameter φ_n among the identified parameters is equal to or larger than the predetermined first threshold δ1, the value of the certain parameter φ_n is set to the first threshold δ1. This reduces the estimation error of the state inside the battery which is caused by the identification error of the certain parameter φ_n. The state inside the secondary battery can be thereby properly estimated. Accordingly, the battery state estimating device and the battery state estimating method of the embodiment of the present invention have industrial applicability.

REFERENCE SIGNS LIST 10 secondary battery
20 load
20 electronic control unit
301 current detecting part
302 voltage detecting part
303 temperature detecting part
304 state variable filter calculation part
305 adaptive identification calculation part
306 open circuit voltage estimating part
307 SOC estimating part
40 ammeter
50 voltmeter
60 temperature sensor

The invention claimed is:

1. A battery state estimating device for estimating a battery state of a secondary battery, the device comprising:
a current sensor configured to detect a current flowing through the secondary battery;
a voltage sensor configured to detect a terminal voltage of the secondary battery;
a current detecting control unit configured to determine a measured current value based on the current detected by the current sensor;
a voltage detecting control unit configured to determine a measured voltage value based on the terminal voltage detected by the voltage sensor;
an identification calculation control unit configured to:
estimate a terminal voltage of the secondary battery, which is based on a battery model of the secondary battery, as an estimated voltage value on the basis of the measured current value and the measured voltage value with the battery model defined as shown in Formula (17) where the measured voltage value is V, the measured current value is I, s is a differential operator, and A(s) and B(s) are polynomial functions of the differential operator s, and
perform a sequential identification calculation of sequentially identifying parameters of the battery model in such a way that a difference between a value based on the measured voltage value and the estimated voltage value converges to zero; and
a limit processing control unit configured to:
determine whether, among the parameters identified by the identification calculation control unit, a highest-degree term parameter corresponding to a coefficient of a term with the highest degree in a polynomial s·A(s) of the Formula (17) is equal to or larger than a predetermined first threshold,
perform upper limit processing of setting a value of the highest-degree term parameter to the first threshold when the highest-degree term parameter is equal to or larger than the first threshold, and
estimate a state of the secondary battery using the highest-degree term parameter after performing the upper limit processing

[Formula 17]

$$V = \frac{B(s)}{s \cdot A(s)} \cdot I. \quad (17)$$

2. The battery state estimating device according to claim 1, further comprising an open circuit voltage estimating control unit configured to estimate an open circuit voltage of the secondary battery on the basis of the parameters identified by the identification calculation control unit, wherein
the open circuit voltage estimating control unit is configured to estimate the open circuit voltage by using a value subjected to the upper limit processing by the limit processing control unit as the highest-degree term parameter among the parameters identified by the identification calculation control unit.

3. The battery state estimating device according to claim 2, wherein the identification calculation control unit is further configured to perform the sequential identification calculation of the parameters by using, as the highest-degree term parameter, a value before being subjected to the upper limit processing.

4. The battery state estimating device according to claim 1, further comprising an initializing control unit configured to:
judge whether the highest-degree term parameter is equal to or larger than a second threshold larger than the first threshold, and
execute initialization processing to cause the identification calculation control unit to perform the sequential identification calculation by using a predetermined initial value when the highest-degree term parameter is equal to or larger than the second threshold.

5. The battery state estimating device according to claim 1, further comprising a temperature sensor configured to detect a battery temperature of the secondary battery, wherein the limit processing control unit is configured to set the first threshold based on the detected battery temperature.

6. The battery state estimating device according to claim 4, further comprising a temperature sensor configured to detect a battery temperature of the secondary battery, wherein the initializing control unit is configured to set the second threshold based on the detected battery temperature.

7. The battery state estimating device according to claim 5, wherein the limit processing control unit is further configured to set the first threshold to a larger value as the detected battery temperature becomes lower.

8. The battery state estimating device according to claim 6, wherein the initializing control unit is further configured to set the second threshold to a larger value as the detected battery temperature becomes lower.

9. A method for estimating a state of a battery comprising:
sensing a current flowing through a secondary battery;
sensing a terminal voltage of the secondary battery;
determining a measured current value based on the current sensed;
determining a measured voltage value based on the terminal voltage sensed;
estimating a terminal voltage of the secondary battery which is based on a battery model of the secondary battery, as an estimated voltage value on the basis of the measured current value and the measured voltage value, with the battery model defined as shown in the Formula (18) where the measured voltage value is V, the measured current value is I, s is a differential operator, and A(s) and B(s) are polynomial functions of the differential operator s;
sequentially identifying parameters of the battery model in such a way that a difference between a value based on the measured voltage value and the estimated voltage value converges to zero;
determining whether, among the identified parameters, a highest-degree term parameter corresponding to a coefficient of a term with the highest degree in a polynomial s·A(s) of the Formula (18) is equal to or larger than a predetermined first threshold;
performing upper limit processing of setting a value of the highest-degree term parameter to the first threshold when the highest-degree term parameter is equal to or larger than the first threshold; and
estimating a state of the secondary battery using the highest-degree term parameter after performing the upper limit processing

[Formula 18]

$$V = \frac{B(s)}{s \cdot A(s)} \cdot I. \quad (18)$$

10. The method according to claim 9, further comprising estimating an open circuit voltage of the secondary battery using a value subjected to the upper limit processing as the highest-degree term parameter among the identified parameters.

11. The method according to claim 9, wherein when the parameters of the battery model are sequentially identified, the sequential identification calculation of the parameters is performed by using, as the highest-degree term parameter, a value before being subjected to the upper limit processing.

12. The method according to claim 9, further comprising determining whether the highest-degree term parameter is equal to or larger than a second threshold larger than the first threshold, wherein the sequential identification calculation of the parameters is performed by using a predetermined initial value when the highest-degree term parameter is equal to or larger than the second threshold.

13. The method according to claim 9, wherein the first threshold is set depending on a battery temperature.

14. The method according to claim 12, wherein the second threshold is set depending on a battery temperature.

15. The method according to claim 13, wherein the first threshold is set to a larger value as the battery temperature becomes lower.

16. The method according to claim 14, wherein the second threshold is set to a larger value as the battery temperature becomes lower.

17. A battery state estimating device comprising:
current sensing means for sensing a current flowing through a secondary battery;
voltage sensing means for sensing a terminal voltage of the secondary battery;
current detecting means for determining a measured current value based on the current sensed by the current sensing means;
voltage detecting means for determining a measured voltage value based on the terminal voltage sensed by the voltage sensing means;
identification calculation means for:
estimating a terminal voltage of the secondary battery, which is based on a battery model of the secondary battery, as an estimated voltage value on the basis of the measured current value and the measured voltage value with the battery model defined as shown in Formula (19) where the measured voltage value is V, the measured current value is I, s is a differential operator, and A(s) and B(s) are polynomial functions of the differential operator s, and
performing a sequential identification calculation of sequentially identifying parameters of the battery model in such a way that a difference between a value based on the measured voltage value and the estimated voltage value converges to zero; and
limit processing means for:
determining whether, among the parameters identified, a highest-degree term parameter corresponding to a coefficient of a term with the highest degree in a polynomial s·A(s) of the Formula (19) is equal to or larger than a predetermined first threshold,
performing upper limit processing of setting a value of the highest-degree term parameter to the first threshold when the highest-degree term parameter is equal to or larger than the first threshold, and
estimating a state of the secondary battery using the highest-degree term parameter after performing the upper limit processing

[Formula 19]

$$V = \frac{B(s)}{s \cdot A(s)} \cdot I. \quad (19)$$

18. The battery state estimating device according to claim 1, further comprising an electronic control unit comprising the current detecting control unit, the voltage detecting control unit, the identification calculation control unit, and the limit processing control unit.

\* \* \* \* \*